United States Patent [19]
Sun et al.

[11] Patent Number: 5,652,166
[45] Date of Patent: Jul. 29, 1997

[54] PROCESS FOR FABRICATING DUAL-GATE CMOS HAVING IN-SITU NITROGEN-DOPED POLYSILICON BY RAPID THERMAL CHEMICAL VAPOR DEPOSITION

[75] Inventors: Shi-Chung Sun; Lin-Sung Wang, both of Taipei, Taiwan

[73] Assignee: United Microelectronics Corporation, Hsinchu, Taiwan

[21] Appl. No.: 583,864

[22] Filed: Jan. 11, 1996

[51] Int. Cl.$^6$ ............................................. H01L 21/8238
[52] U.S. Cl. .................... 437/56; 437/40 GS; 437/34; 437/233
[58] Field of Search ................... 437/56, 57, 58, 437/41 RCM, 238, 239, 34, 40 GS, 233

[56] References Cited

U.S. PATENT DOCUMENTS

| | | | |
|---|---|---|---|
| 5,278,441 | 1/1994 | Kang et al. | 437/34 |
| 5,376,592 | 12/1994 | Hashiguchi et al. | 437/239 |
| 5,397,720 | 3/1995 | Kwong et al. | 437/239 |
| 5,464,783 | 11/1995 | Kim et al. | 437/239 |
| 5,478,765 | 12/1995 | Kwong et al. | 437/978 |

OTHER PUBLICATIONS

Sun et al "Rapid Thermal Chemical Vapor Deposition of Nitrogen–Doped Polysilicon for High Performance and High Reliability CMOS Technology"; Apr. 12–17, 95; Rapid Thermal and Integrated Processing IV Symposium, pp. 329–334.

Uchiyama, et al, "High Performance Dual–Gate Sub––Halfmicron CMOSFETS . . . in an $N_2O$ Ambient", IEDM 1990, pp. 425–428.

Chu et al, "Thickness . . . of Ultrathin Oxide Grown by Rapid Thermal Oxidation of Silicon in $N_2O$"; J. Electrochem. Soc., vol. 138, No. 6, Jun. 1991, L13–L16.

"A P+ Poly-Si Gate with Nitrogen–Doped Poly–Si Layer for Deep Submicron PMOSFETs", ECS Spring Meeting Proc., p. 9, 1991, S. Nakayama, (8pgs).

"The Influence of Fluorine on Threshold Voltage Instabilities in P+ Polysilicon Gated P–Channel MOSFETs", F.A. Baker, et al; Tech. Dig. of IEDM, p. 443, 1989 (4pgs).

"Novel NICE (Nitrogen Implantation into CMOS Gate Electrode and Source–Drain) Structure for High Reliability and High Performance 0.25 um Dual Gate CMOS", T. Kuroi, et al; Tech Dig. of IEDM, p. 325, 1993, (4pgs).

*Primary Examiner*—Michael Trinh
*Attorney, Agent, or Firm*—Ladas & Parry

[57] ABSTRACT

A process for fabricating dual-gate CMOS of semiconductor devices having in-situ nitrogen-doped polysilicon by rapid thermal chemical vapor deposition in a rapid thermal reactor is disclosed. The process comprises the steps of first fabricating components of the dual-gate CMOS on a semiconductor silicon substrate. The dual-gate CMOS components includes P- and N-wells and source/drain regions formed in the silicon substrate. Gate oxide for the dual-gate CMOS is then grown. A thin nitrogen-doped polysilicon film is then deposited over the gates, and followed by the deposition of a undoped polysilicon film, which covers over the surface of the thin nitrogen-doped polysilicon film. Ions are then implanted into the dual-gates CMOS. In the process, the thin nitrogen-doped polysilicon film is deposited by introducing $SiH_4$ and $NH_3$ gas mixture into the rapid thermal reactor under a pressure of about 0.4 torr at about 750° C. The thin nitrogen-doped polysilicon film has a thickness of about 60 Å. The undoped polysilicon film is formed by deposition of $SiH_4$ after the $NH_3$ gas is evacuated from the rapid thermal reactor, and has a thickness of about 2,000 to 3,000 Å. $N_2O$, NO and $O_2$ gases may be utilized in the rapid thermal procedure for the formation of the oxide layer. Once the oxide layer is formed, the process of forming polysilicon may be continued in the reaction chamber without needing to be exposed to the ambient air. Contamination to the device is therefore avoided and the product yield rate improved. The rapid thermal reactor employed in the process is a load-locked single reactor.

7 Claims, 4 Drawing Sheets

PROCESS FOR FABRICATING DUAL-GATE CMOS HAVING IN-SITU NITROGEN-DOPED POLYSILICON BY RAPID THERMAL CHEMICAL VAPOR DEPOSITION

BACKGROUND OF THE INVENTION

1. Field of the Invention

The present invention relates in general to a process for fabricating dual-gate CMOS for a semiconductor device. In particular, the present invention relates to a process for fabricating in-situ nitrogen-doped polysilicon for dual-gate CMOS utilizing the method of rapid thermal chemical vapor deposition.

2. Technical Background

The dual-gate CMOS structure using the $p^+$ polysilicon for PMOSFET has been widely studied to improve its short-channel behavior. Unfortunately, boron penetration from heavily-doped $p^+$ polysilicon causes deterioration of the gate oxide and unstable threshold voltage. Several structures have been proposed to avoid boron penetration. For example, in an article "A $P^+$ Poly-Si Gate with Nitrogen-Doped Poly-Si Layer for Deep Submicron PMOSFETs," ECS Spring Meeting Proc., p. 9, 1991, S. Nakayama disclosed a new $p^+$ polysilicon gate with a very thin nitrogen-doped polysilicon layer at the polysilicon gate/$SiO_2$ interface for deep submicron PMOSFETs. Likewise, F. A. Baker et al. in their article in Tech. Dig. of IEDM, p. 443, 1989, as well as T. Kuroi et al. in their article in Tech. Dig. of IEDM, p. 325, 1993, all addressed the same problems of the conventional dual-gate CMOS as indicated above.

However, no prior art process has been capable of fabricating a dual-gate CMOS having its gate configuration through an in-situ process without atmospheric exposure in a single load-locked rapid thermal reactor, that achieves good device electrical characteristics. A dual-gate CMOS may only be considered to feature good electrical behavior if it presents good suppression of boron penetration, smaller flatband voltage shift, improved charge trapping and reliability characteristics.

SUMMARY OF THE INVENTION

It is therefore the primary object of the present invention to provide a process for fabricating in-situ nitrogen-doped polysilicon for the dual-gate CMOS of semiconductor devices utilizing the RTCVD method that provides the capability of effective suppression against boron penetration.

It is another object of the present invention to provide a process for fabricating in-situ nitrogen-doped polysilicon for the dual-gate CMOS of semiconductor devices utilizing the RTCVD method that allows the oxide layer and the gate polysilicon to be formed in the rapid thermal procedures carded out in the same rapid thermal reaction chamber, without requiting exposure to the ambient air, thereby preventing contamination, and improving the device fabrication yield rate.

It is yet another object of the present invention to provide a process for fabricating in-situ nitrogen-doped polysilicon for dual-gate the CMOS of semiconductor devices utilizing the RTCVD method that features a small flatband voltage shift.

It is still another object of the present invention to provide a process for fabricating in-situ nitrogen-doped polysilicon for the dual-gate CMOS of semiconductor devices utilizing the RTCVD method that features improved charge trapping characteristics.

It is still yet another object of the present invention to provide a process for fabricating in-situ nitrogen-doped polysilicon for the dual-gate CMOS of semiconductor devices utilizing the RTCVD method that features improved reliability.

To achieve the above-identified objects, the present invention provides a process for fabricating the dual-gate CMOS of semiconductor devices having in-situ nitrogen-doped polysilicon by rapid thermal chemical-vapor deposition in a rapid thermal reactor. The process comprises the steps of first fabricating components of the dual-gate CMOS on a semiconductor silicon substrate. The dual-gate CMOS components include P- and N-wells and source/drain regions formed in the silicon substrate. Gate oxide for the dual-gate CMOS is then grown. A thin nitrogen-doped polysilicon film is then deposited over the gates, and followed by the deposition of a undoped polysilicon film, which covers the surface of the thin nitrogen-doped polysilicon film. Ions are then implanted into the dual-gates CMOS. The process is characterized in that the thin nitrogen-doped polysilicon film is deposited by introducing $SiH_4$ and $NH_3$ gas mixture into the rapid thermal reactor under a pressure of about 0.4 torr at about 750° C. The thin nitrogen-doped polysilicon film has a thickness of about 60 Å. The undoped polysilicon film is formed by deposition after the $NH_3$ gas is evacuated from the rapid thermal reactor, and has a thickness of about 2,000 to 3,000 Å. The rapid thermal reactor employed in the process is a load-locked single reactor.

BRIEF DESCRIPTION OF THE DRAWINGS

Other objects and features of the present invention are described with reference to the preferred embodiments exemplified below with the accompanying drawing in which FIG. 1 schematically shows the cross-sectional view of the dual-gate CMOS fabricated in accordance with a preferred embodiment of the present invention utilizing nitrogen incorporation into the RTCVD polysilicon gate thereof.

DETAILED DESCRIPTION OF THE PREFERRED EMBODIMENT

A dual-gate CMOS structure using the $p^+$ polysilicon for PMOSFET, as described above, has been widely studied to improve its short-channel behavior. The present invention proposes for the first time the use of a thin layer of nitrogen-doped polysilicon formed by an in-situ rapid thermal chemical vapor deposition (RTCVD) method that has effectively suppressed boron penetration through the ultra-thin gate oxide.

A novel gate structure with excellent electrical properties and reliability in accordance with a preferred embodiment of the present invention may be fabricated by in-situ rapid thermal multiprocessing. Gate oxide was grown first by low pressure rapid thermal oxidation in $N_2O$, followed by sequential RTCVD of an ultra-thin layer (6 nm) of nitrogen-doped polysilicon and then undoped polysilicon. As will be described hereafter, the results of such fabrication demonstrate the suppression of boron penetration and high device reliability.

Figure 1:
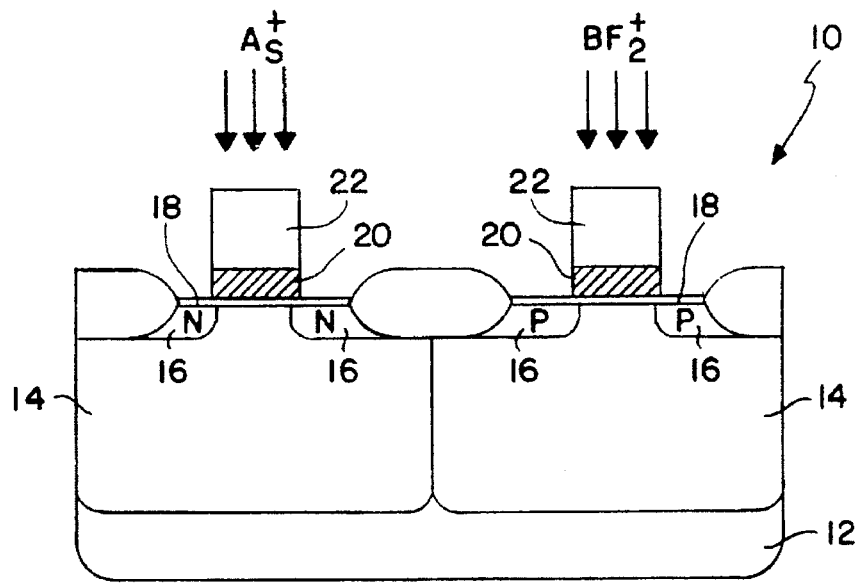

FIG. 1 schematically shows the cross-sectional view of the dual-gate CMOS 10 of the present invention utilizing nitrogen incorporation into the RTCVD polysilicon gate. The dual-gate CMOS 10 is fabricated in a preferred embodiment as described below.

Step 1

Fabricate components of the dual-gate CMOS device on a silicon substrate.

As is seen in FIG. 1, this may be done by employing a semiconductor silicon substrate 12 and implementing the fabrication procedures known in the art that establish the P- and N-wells 14 in the substrate 12. Source/drain regions 16 for the dual-gate CMOS device 10 are also fabricated as seen in the drawing.

Step 2

Grow gate oxide for the dual-gate CMOS device.

As is seen in the drawing, gate oxide 18 is then grown. The gate oxide 18 may be grown at a temperature of about 1,050° C. in a low-pressure $N_2O$ ambient with a pressure of about 40 torr. This gate oxide growing condition may allow improvement of the thickness uniformity and reliability of the oxide layer, as is shown by the work of the inventor of the present invention and several others in an article in MRS Symp. Proc., 342, p. 181, 1994.

Step 3

Deposit a thin nitrogen-doped polysilicon film over the surface of the gate oxide layers.

In the drawing, a thin nitrogen-doped polysilicon film 20 of about 60 Å is deposited by introducing $SiH_4$ and $NH_3$ gas mixture under a pressure of about 0.4 torr at about 750° C. As persons skilled in the art may well appreciate, this procedural step may include the proper etching with adequate photomasking that forms the thin nitrogen-doped polysilicon film into the desired shape over the surface of the gate oxide layer 18.

Step 4

Deposit a undoped polysilicon film over the surface of the nitrogen-doped polysilicon film.

As is then seen in the drawing, a undoped polysilicon film 22 with a thickness of about 3,000 Å is subsequently formed by deposition after the $NH_3$ gas is evacuated from the chamber. Similar to the case in the previous step 3, the formation of the undoped polysilicon layer 22 further atop the gate oxide 18 would also involve a photolithography procedure to form the film 22 into its designated shape, such as is shown in the drawing.

Step 5

Implant ions into the dual-gates CMOS device.

As is seen in the drawing, ions of adequate selection, such as $As^+$ and $BF_2^+$ are then properly implanted into the designated area of the dual-gate CMOS to conclude the fabrication of the dual-gate CMOS device 10.

It must be emphasized that all these in-situ fabrication steps were performed without atmospheric exposure in a load-locked rapid thermal reactor.

Figure 2:
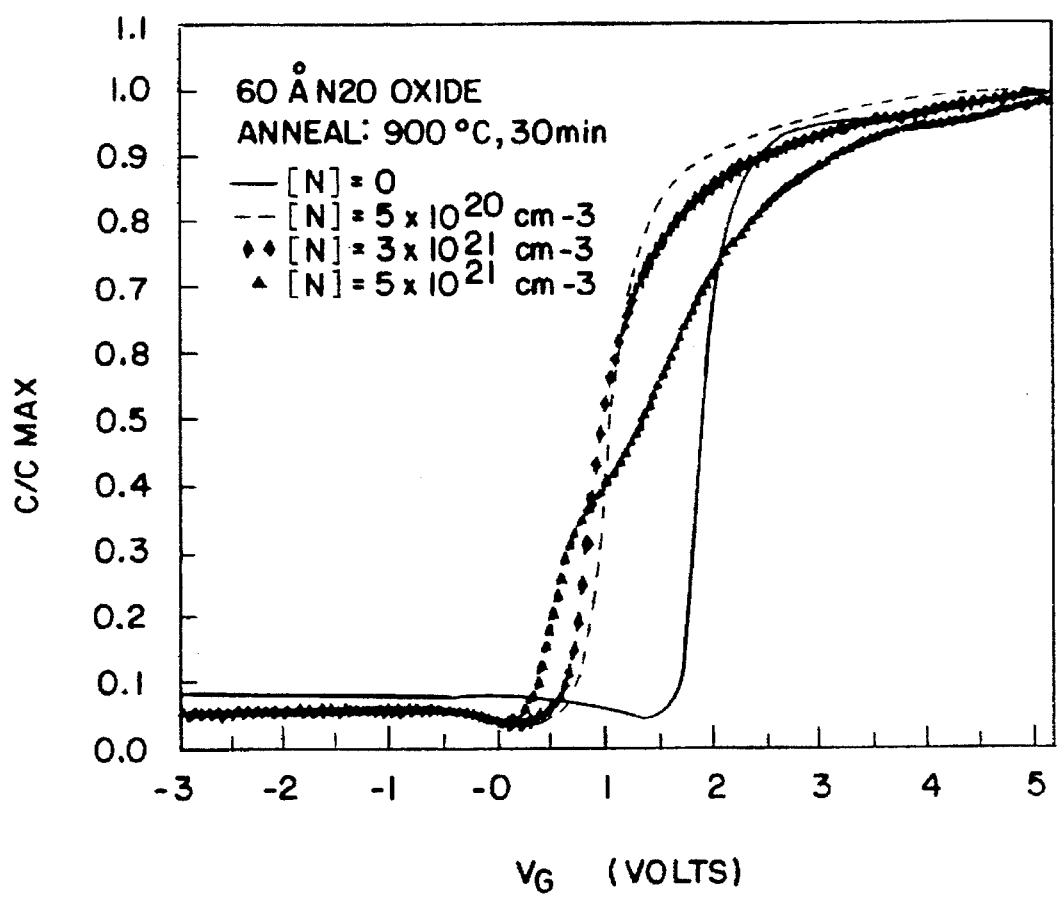
FIG. 2 shows the high-frequency C-V curves of MOS capacitors for different nitrogen concentrations.
Figure 3:
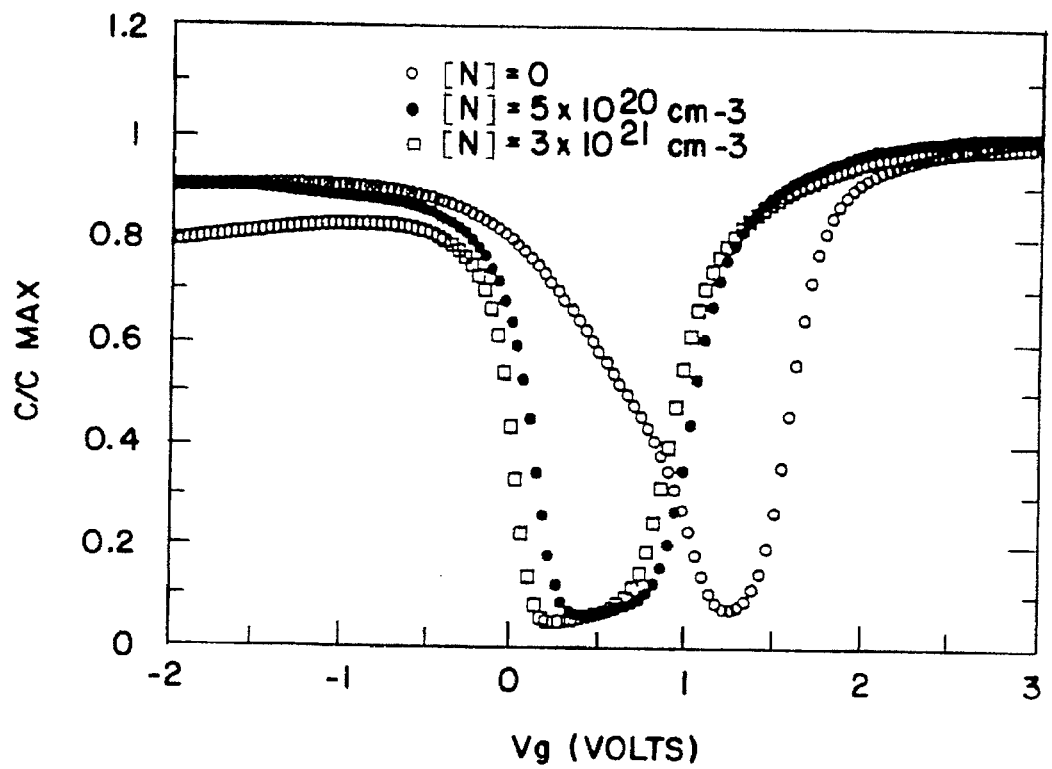
FIG. 3 shows the quasi-static C-V characteristics of $p^+$ gate capacitors.

Several testing and experiments were conducted to compare the various characteristics of the dual-gate CMOS fabricated in accordance with the preferred process of the present invention to that of the prior art. Specifically, FIG. 2 shows the high-frequency C-V curves of MOS capacitors for different nitrogen concentrations. Boron penetration is obvious on the capacitor without nitrogen-doped layer. The flatband voltage shifts in the negative direction with increasing mount of nitrogen dopings. Boron penetration was effectively suppressed at a nitrogen concentration of $5 \times 10^{20}$ $cm^{-3}$. For doping higher than $3 \times 10^{21}$ $cm^{-3}$, the flatband voltages are far from the desired degenerately-doped values. This indicates a depletion of carrier concentration in the polysilicon/oxide interface, as evident in the quasi-static C-V curves shown in FIG. 3.

Figure 4:
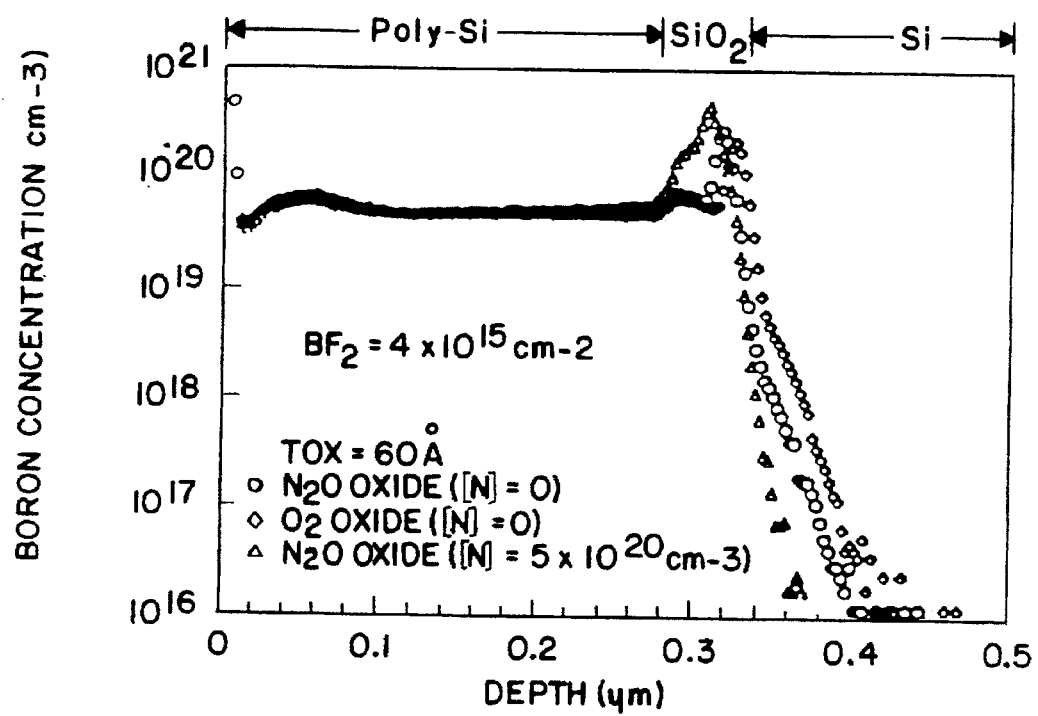
FIG. 4 shows the SIMS depth profiles of boron measured on three samples after a $4 \times 10^{15}$ $cm^{-2}$ $BF_2$ implant and 900° C./30 minutes heat cycle.
Figure 5:
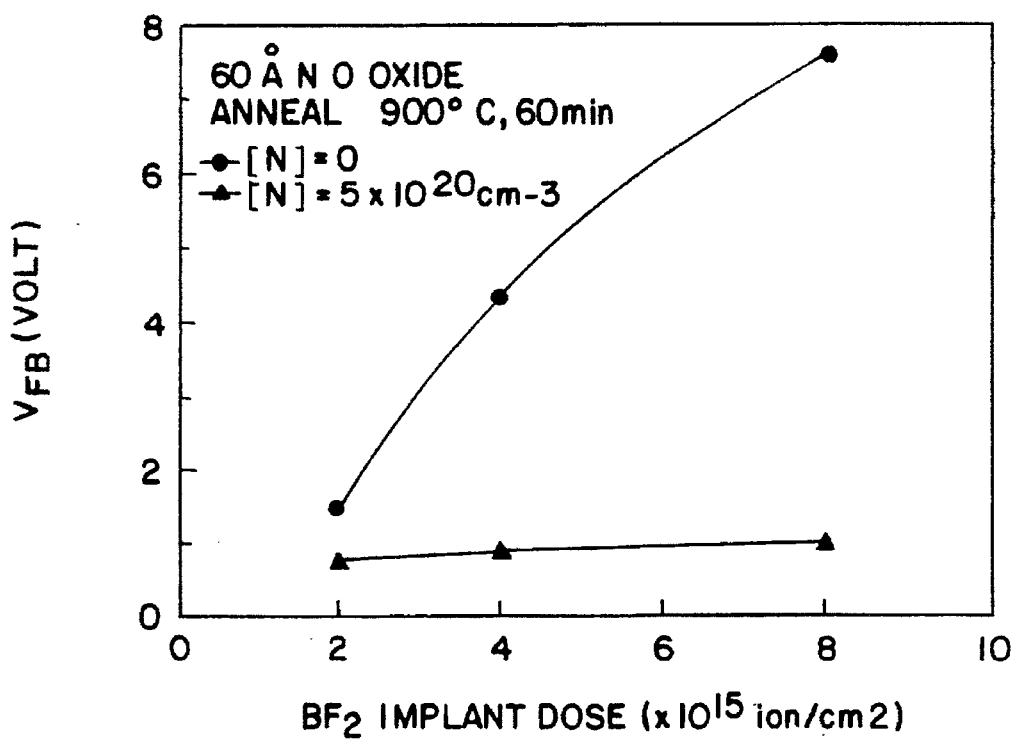
FIG. 5 shows the effectiveness of nitrogen-doped layer at high $BF_2$ doses.
Figure 6:
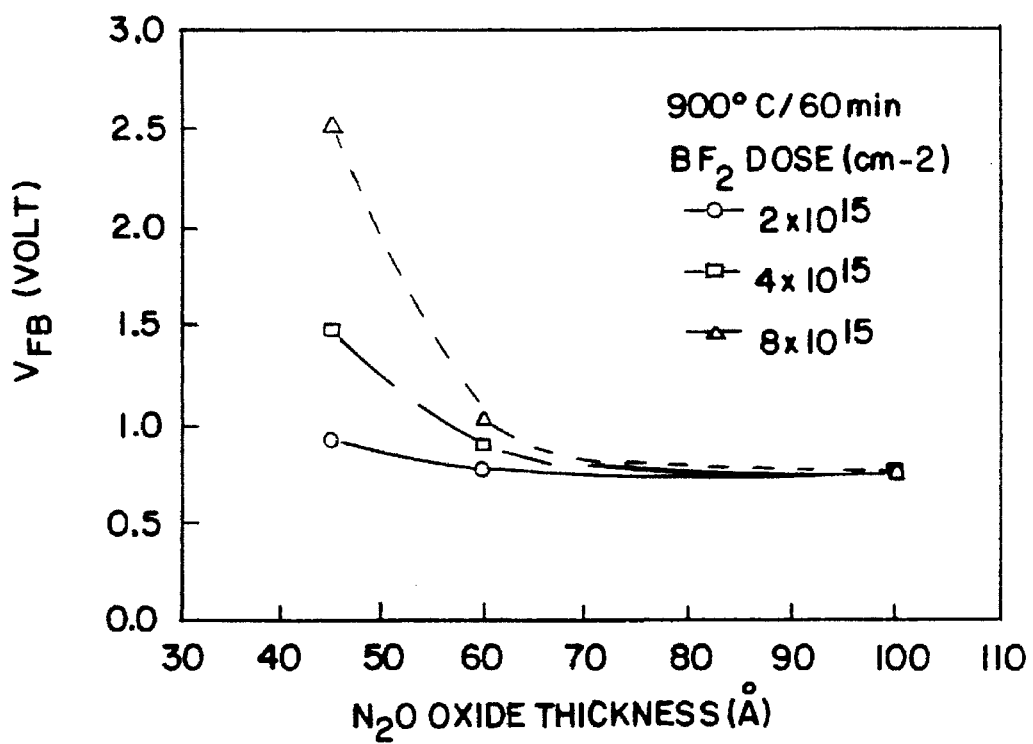
FIG. 6 shows the dependence of flatband voltage on gate oxide thickness with the $BF_2$ dose as a parameter.

FIG. 4 presents the SIMS depth profiles of boron measured on three samples after a $4 \times 10^{15}$ $cm^{-2}$ $BF_2$ implant and 900° C./30 minutes heat cycle. The sample of $O_2$-grown oxide without the nitrogen-doped layer clearly exhibits boron penetration. The $N_2O$-grown nitridized oxide sample without a nitrogen layer retards the boron diffusion through the $Si/SiO_2$ interface, but can not stop the boron penetration. The sample with a nitrogen layer displays no boron penetration. At the same time, the segregation of boron into the gate oxide can be reduced.

Figure 8:
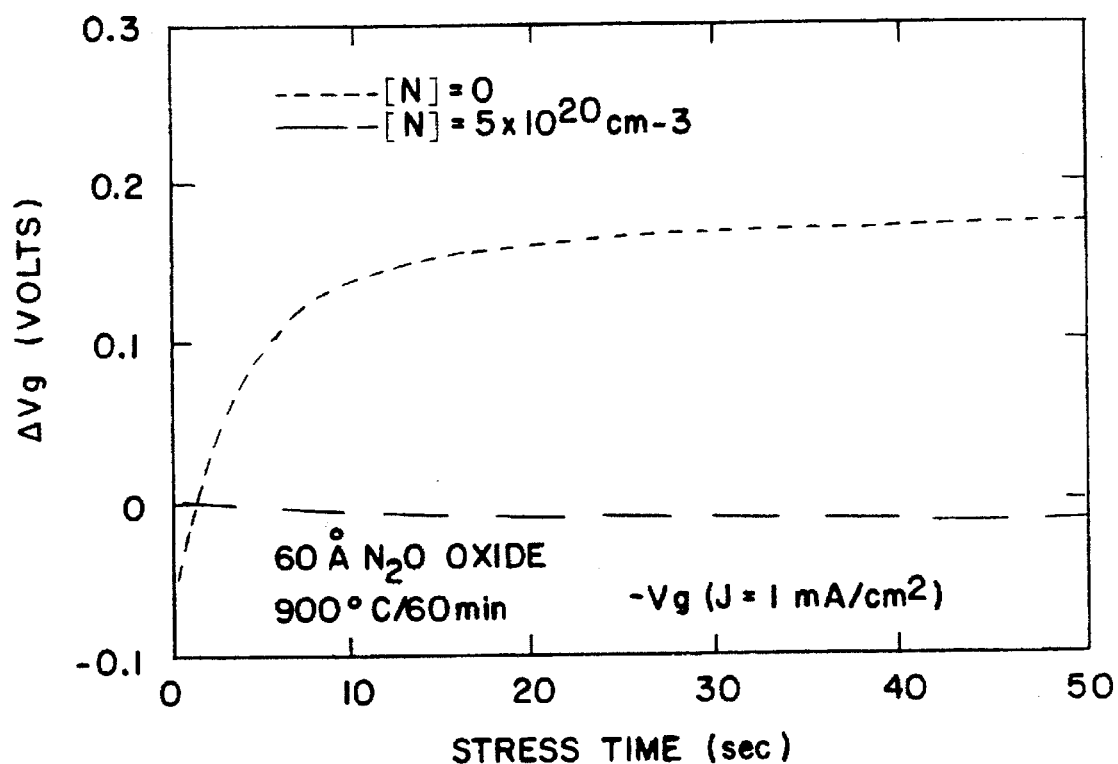
FIG. 8 shows comparisons of the charge trapping characteristics.

FIG. 8 demonstrates the effectiveness of the nitrogen-doped layer even at high $BF_2$ doses. Without the nitrogen layer, a small flatband voltage shift occurs at $2 \times 10^{15}$ $cm^{-2}$. It rises to almost 8 volts at $8 \times 10^{15}$ $cm^{-2}$. FIG. 9 shows the dependence of flatband voltage on gate oxide thickness with $BF_2$ dose as a parameter. Susceptibility to boron penetration increases drastically as the oxide thickness is scaled down to 43 Å.

Figure 7:
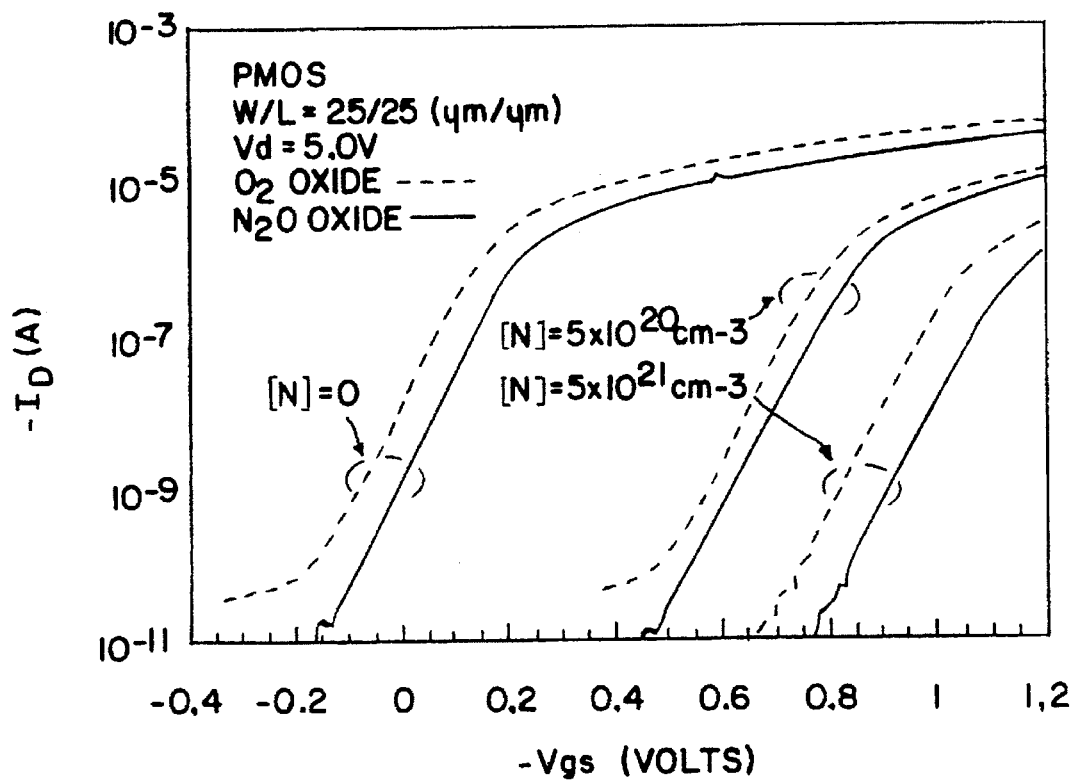
FIG. 7 shows the subthreshold characteristics of the PMOSFET.

FIG. 7 shows the subthreshold characteristics of PMOSFET. FETs with nitrogen doped layer=0, $5 \times 10^{20}$, and $5 \times 10^{21}$ $cm^{-3}$ have threshold voltages of 0.0, −0.8, and −1.0 volts respectively. The subthreshold slopes are all around 73 mv/decade. FIG. 8 compares the charge trapping characteristics. Boron penetration into $SiO_2$ has resulted in a significant increase of hole trapping on the control sample. Nitrogen-doped sample shows reduced charge trapping due to suppressed boron penetration, resulting in improved $Q_{BD}$.

The present invention has demonstrated that in-situ nitrogen-doped RTCVD polysilicon film is highly effective in suppressing boron penetration, leading to a smaller flatband voltage shift, improved charge trapping and reliability characteristics.

While the invention has been described by way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

We claim:

1. A process for fabricating dual-gate CMOS of semiconductor devices having in-situ nitrogen-doped polysilicon by rapid thermal chemical vapor deposition in a rapid thermal reactor, said process comprising the steps of:

fabricating components of said dual-gate CMOS on a semiconductor silicon substrate, said dual-gate CMOS components including P- and N-wells and source/drain regions formed in said silicon substrate;

growing gate oxide for said dual-gate CMOS;

depositing a thin nitrogen-doped polysilicon film over said gates;

depositing an undoped polysilicon film over said thin nitrogen-doped polysilicon film; and implanting ions to said dual-gates CMOS;

wherein:

said thin nitrogen-doped polysilicon film is deposited by introducing $SiH_4$ and $NH_3$ gas mixture into said rapid thermal reactor under a pressure of about 0.4 torr at about 750° C.

2. The process for fabricating dual-gate CMOS of semiconductor devices having in-situ nitrogen-doped polysilicon by rapid thermal chemical vapor deposition of claim 1, wherein said thin nitrogen-doped polysilicon film has a thickness of about 60 Å.

3. The process for fabricating dual-gate CMOS of semiconductor devices having in-situ nitrogen-doped polysilicon by rapid thermal chemical vapor deposition of claim 2, wherein said undoped polysilicon film is formed by deposition after said $NH_3$ gas is evacuated from said rapid thermal reactor.

4. The process for fabricating dual-gate CMOS of semiconductor devices having in-situ nitrogen-doped polysilicon by rapid thermal chemical vapor deposition of claim 3, wherein said undoped polysilicon film has a thickness of about 2,000 to 3,000 Å.

5. The process for fabricating dual-gate CMOS of semiconductor devices having in-situ nitrogen-doped polysilicon by rapid thermal chemical vapor deposition of claim 4, wherein said ions implanted include As and $BF_2$ ions.

6. The process for fabricating dual-gate CMOS of semiconductor devices having in-situ nitrogen-doped polysilicon by rapid thermal chemical vapor deposition of claim 5, wherein said gate oxide is grown at a temperature of about 1,050° C. in a low-pressure $N_2O$ ambient with a pressure of about 40 torr.

7. The process for fabricating dual-gate CMOS of semiconductor devices having in-situ nitrogen-doped polysilicon by rapid thermal chemical vapor deposition of claim 6, wherein said rapid thermal reactor is a load-locked single reactor.

* * * * *